United States Patent [19]

Gibson

[11] Patent Number: 4,747,140

[45] Date of Patent: May 24, 1988

[54] LOW DISTORTION FILTERS FOR SEPARATING FREQUENCY OR PHASE MODULATED SIGNALS FROM COMPOSITE SIGNALS

[75] Inventor: John J. Gibson, Princeton, N.J.

[73] Assignee: RCA Corporation, Princeton, N.J.

[21] Appl. No.: 946,042

[22] Filed: Dec. 24, 1986

[51] Int. Cl.4 ............................................. H04H 5/00
[52] U.S. Cl. ...................................... 381/13; 358/144
[58] Field of Search ................. 381/2, 3, 13; 358/143, 358/144

[56] References Cited

U.S. PATENT DOCUMENTS

| | | | |
|---|---|---|---|
| 4,072,984 | 2/1978 | Kaiser | 358/31 |
| 4,329,714 | 5/1982 | Pritchard | 358/198 |
| 4,547,737 | 10/1985 | Gibson | 329/50 |
| 4,569,072 | 2/1986 | van Roermund | 381/13 |

OTHER PUBLICATIONS

L. B. Tyler et al, "A Companding System for Multichannel TV Sound", IEEE Trans. on Consumer Elec., vol. CE-30, No. 4, Nov. 84, pp. 633-640.

*Primary Examiner*—Forester W. Isen
*Attorney, Agent, or Firm*—E. M. Whitacre; P. J. Rasmussen; E. P. Herrmann

[57] ABSTRACT

A circuit for separating FM signals from a composite signal utilizes a comb filter having successive frequency response nulls which span the frequency spectrum of the FM signal to be separated. The comb filter response is phase linear and defines the pass-band of the desired signal. A nonideal or phase nonlinear bandpass filter can be cascaded with the comb filter to attenuate out of band signals. The cascade combination of the comb filter and nonlinear bandpass filters is a cost effective substitute for the conventional, complicated phase linear bandpass filter having a boxcar frequency response traditionally used to separate FM signals.

10 Claims, 5 Drawing Sheets

LOW DISTORTION FILTERS FOR SEPARATING FREQUENCY OR PHASE MODULATED SIGNALS FROM COMPOSITE SIGNALS

This invention relates to the separation of phase or frequency modulated signals from composite signals.

BACKGROUND OF THE INVENTION

In filtering phase or frequency modulated signals it is particularly important not to introduce phase nonlinearities into the signal since such nonlinearities cannot be effectively corrected or compensated (as distinguished from linear distortion). Thus, if the components of, for example, a composite stereo sound signal including an FM component, are to be separated without nonlinear distortion, the filters employed for separation must be phase linear at least over the pass-bands of the respective components.

Desirably, such filters will have a boxcar shaped frequency response and be phase linear and distortionless across the pass-band. Practically, such filters are difficult and expensive to realize.

SUMMARY OF THE INVENTION

The present invention comprises filters for separating frequency or angle modulated signals from composite signals, comprising the cascade connection of a comb filter having a pass-band in the frequency range of interest and a bandpass filter. The comb filter defines the frequency response of the separated component and does not cause nonlinear distortion of the instantaneous signal frequency. The bandpass filter, which may have a very sufficiently attenuate out of band signal components.

The combination of the comb filter and nonideal bandpass filter do not provide the desired phase linear boxcar frequency response, but rather a phase linear cosinusoidal amplitude versus frequency response. The cosinusoidal frequency response, however, is linear and compensible.

DETAILED DESCRIPTION

This invention may be practiced on analog or digital signals, and with regard to the latter may be practiced in either parallel-bit or serial-bit format. For purposes of explanation, the invention will be described in the environment of a television receiver for reproducing BTSC stereo sound.

The stereo sound system currently utilized in the United States was selected by the Electronic Industries Association (EIA) under the auspices of its Broadcast Television Systems Committee (BTSC). The sound signal comprises a composite signal which is transmitted on a carrier in the spectrum space of existing monophonic television sound signals. The composite signal includes a left plus right (L+R) monophonic audio signal, a pilot signal equal to the horizontal scanning frequency, $f_H$, (15.734 kHz), of the TV receiver, a difference signal (L−R) which amplitude modulates a carrier having a frequency of $2f_H$ and a second audio program (SAP) signal which frequency modulates a carrier having a frequency of $5f_H$. The signal spectrum of the composite sound signal is illustrated in FIG. 1.

Figure 1:
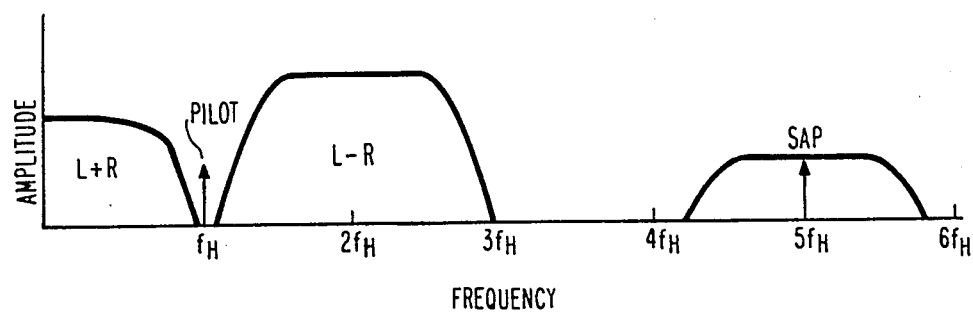
FIG. 1 is a waveform diagram illustrating the frequency spectrum of a BTSC composite stereo TV sound signal.

The composite sound signal, which is transmitted as a frequency modulated carrier component of a braodcast television signal, is detected in the television receiver and demodulated to a baseband composite sound signal with a frequency spectrum as illustrated in FIG. 1. The composite sound signal is applied to circuitry such as is illustrated in FIG. 2 for subsequent processing to condition the audio signals for sound reproduction.

Figure 2:
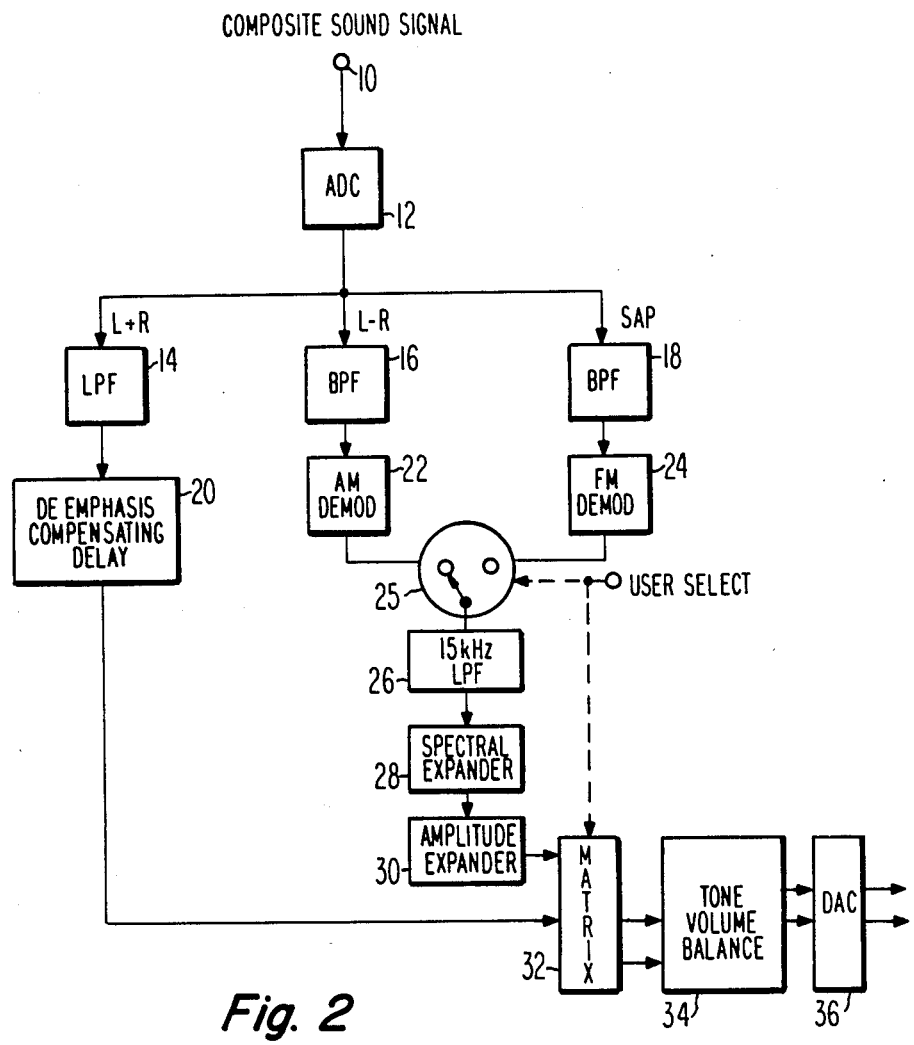
FIG. 2 is a block diagram of circuitry for processing stereo sound signals in a TV receiver.

Referring to FIG. 2, the demodulated composite sound signal is coupled to an analog-to-digital converter (ADC) 12 via connection 10. ADC 12 converts the sound signal to digital samples at a rate satisfying the Nyquist sampling criterion, to preclude aliasing. The digital sound signal samples are coupled to a low-pass filter 14 which has a pass-band of approximately 15 kHz. Low-pass filter 14 selectively extracts the (L+R) component of the composite sound signal. The (L+R) component from filter 14 is coupled to processing circuitry 20 which may include, for example, de-emphasis circuitry, peaking circuitry, compensating time delays, etc. Output signal from processing circuitry 20 is coupled to the matrix 32 wherein it is combined with processed (L−R) signal to produce the left, L, and right, R, audio signals for stereo reproduction.

Because the composite sound signal is transmitted on an FM carrier, and because the (L−R) and SAP components are at higher frequencies than the (L+R) component, they are subject to greater noise distortion. To improve this situation, the BTSC system employs companding of the (L−R) and SAP signals. In addition, it was decided to use the same compander for both the (L−R) and the SAP signals to reduce the cost of the receiver. This is possible because the user will only select to hear one or the other of the stereo signals or the SAP signal. Thus, the companding circuitry in the receiver is made switchable between the (L−R) and the SAP channels.

Referring again to FIG. 2, composite digital sound signal from ADC 12 is also coupled to a bandpass filter 16 which selectively extracts the (L−R) component from the composite sound signal. The (L−R) component is coupled to an amplitude demodulator 22 which removes the $2f_H$ carrier from the (L−R) signal. It will be appreciated by those skilled in the art of signal processing that if the amplitude demodulator 22 is a synchronous demodulator, then bandpass filter 16 may be eliminated. The demodulated (L−R) signal is coupled to a low-pass filter 26 via a user actuated switch 25. Low-pass filter 26 has a pass-band of approximately 15 kHz and reduces out of band noise. The output of the low-pass filter 26 is coupled to the cascade connection of a spectral expander 28 and an amplitude expander 30 which comprise the receiver compansion system. Details of the compansion function may be found in the article by L.B. Tyler et al., entitled "A Companding System for Multichannel TV Sound", IEEE Transactions on Consumer Electronics, Vol. CE-30, No. 4, Nov. 1984, pp. 633–640, incorporated herein by reference.

The composite sound signal from ADC 12 is further coupled to the bandpass filter 18 which selectively extracts the SAP signal. The SAP signal is coupled to the FM demodulator 24 which removes the $5f_H$ carrier from the modulating SAP signal. The demodulated SAP signal is coupled to the low-pass filter 26 and the compansion system via user activated switch 25.

The output of the expander 30 is coupled to a second input of the matrix 32. When the (L−R) signal is coupled to the matrix 32 it generates the left, L, and right, R, signals which are coupled to circuitry 34. Circuitry 34 performs the function of tone, balance and volume control. The conditioned L and R signals are then converted to analog form in a digital-to-analog converter (DAC) 36 for application to a speaker system.

Alternatively, if the SAP signal is coupled to the matrix 32, the matrix 32 is conditioned by the user select signal, to output monophonic signals on the L and R signal paths to circuitry 34.

The SAP signal may conveniently be separated from the composite sound signal by the cascade connection of a comb filter and a relatively simple bandpass filter. A comb filter combines a direct and a delayed representation of the direct signal. Consider a direct FM signal to be represented by $e^{ix(t)}$ and the delayed signal to be represented by $e^{ix(t-T)}$ where T is the period of delay. Both signals will have substantially identical amplitudes and the same carrier freqeuncy w. The signal x(t) may be expressed as $$x(t) = wt + \alpha + \phi(t) \tag{1}$$

and the signal x(t−T) is thus $$x(t-T) = wt + \beta + \phi(t-T) \tag{2}$$

where α and β are constants and $\phi(t)$ and $\phi(t-T)$ represent the instantaneous phase of the modulating signal. The sum signal S(t) produced by a comb filter is given by $$S(t) = \exp[i(wt + (\alpha+\beta)/2 + (\phi(t)+\phi(t-T))/2] \cdot \cos((\alpha-\beta)/2 + (\phi(t)-\phi(i\,t-T))/2). \tag{3}$$

The phase term of the signal S(t), which is represented by the exponent, is linear as desired. The amplitude function of the signal S(t) is defined by the term cos $((\alpha-\beta)/2 + (\phi(t)-\phi(t-T)/2)$. The argument of the cosine term must be prevented from making 180 degree phase excursions to preclude the introduction of audible "clicks." This constrains the term $\phi(t)-\phi(t-T)$ to be less than 90 degrees. This condition is satisfied if the product TΔF is maintained less than ½, where ΔF is the maximum deviation of the modulating frequency.

For comb filter implemented in the SAP channel, the maximum frequency deviation is limited to be less than 10 kHz. The maximum signal delay T is therefore limited to 50 μsec. The SAP carrier is located at a frequency $5f_H$ which is five times the horizontal scanning frequency of the television signal. It is likely that the composite sound signal will contain harmonics of the horizontal scanning frequency $f_H$ which tend to cause buzz in the reproduced audio signals. In addition, the (L−R) signal modulates a carrier of $2f_H$. The delay of the comb filter device can be advantageously selected to produce nulls or "teeth" in the comb filter repsonse to occur at even multiples of the horizontal scanning frequency to suppress even harmonics of the horizontal scanning frequency and the L−R component of the composite sound signal.

Figure 3A:
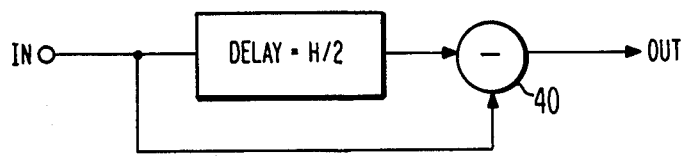
FIG. 3A is a block diagram of a comb filter for separating FM signal from composite sound signals, embodying the present invention.
Figure 3B:
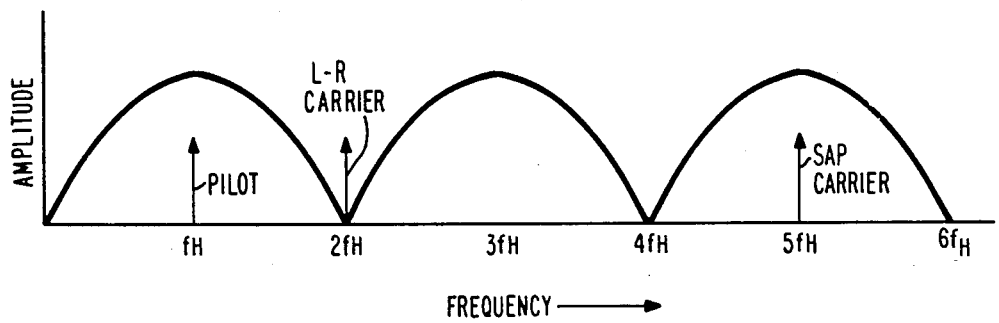
FIG. 3B is a waveform diagram of the frequency response of the FIG. 3A comb filter.

A delay of one-half the horizontal scanning period (31.746 μsec) produces such a response and satisfies the constraint that T be less than 50 μsec for the SAP signal. FIG. 3A illustrates a comb filter, in general form, which produces a filter response having nulls at even multiples of $f_H$ and a bandpass over the frequency spectrum occupied by the SAP signal. FIG. 3B illustrates the frequency response of the comb filter of FIG. 3A.

Figure 4:
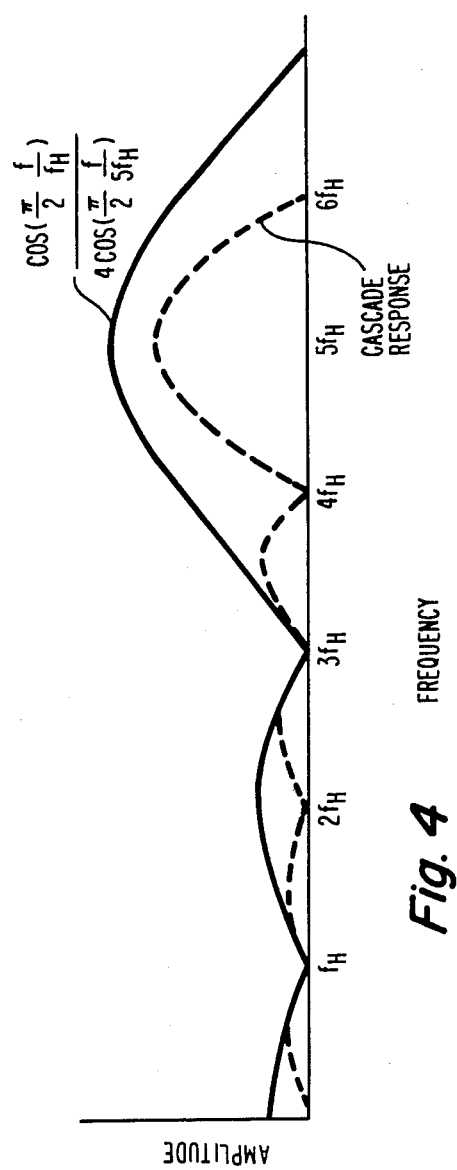
FIG. 4 is a waveform diagram of a bandpass filter which may be cascaded with the FIG. 3A comb filter for separating the SAP signal from BTSC composite sound signals.

Next consider cascading a bandpass filter with the comb filter, which bandpass filter has a relatively wide pass-band in the spectrum of interest, such that any nonlinear phase characteristics of the bandpass filter do not occur in the range of the signal spectrum. Such a filter characteristic is illustrated in FIG. 4 drawn with the solid line. The transfer function, H(f), of the bandpass filter is described by the equation $$H(f) = [\cos(\pi/2\,f/f_H)]/[4\cos\,(\pi/2\,f/5f_H)]. \tag{4}$$

This transfer function has nulls at $f_H$ and $3f_H$ which will cancel the pilot signal at $f_H$ and the third harmonic $3f_H$ of the horizontal scanning frequency.

The composite transfer function of the bandpass and comb filters is illustrated by the dashed line in FIG. 4. It can be seen that the pass-band of the SAP channel is defined by the comb filter and that the (L+R), the (L−R) and the pilot signal ranges of the frequency spectrum are significantly attenuated. In addition, all harmonics of the horizontal scanning frequency $f_H$, in the spectrum of interest, except the SAP carrier of $5f_H$ are substantially eliminated.

Figure 5:
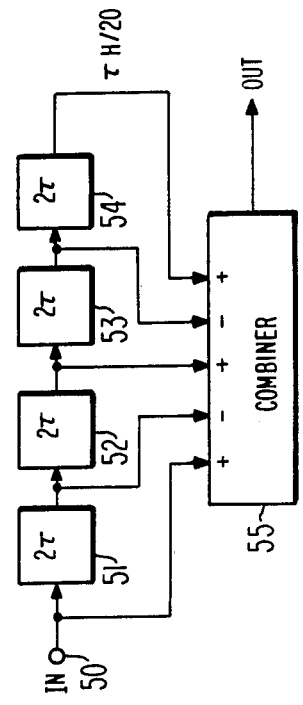
FIG. 5 is a block diagram of an exemplary bandpass filter which may be implemented to provide the frequency response illustrated in FIG. 4.

A bandpass filter for realizing the transfer function illustrated in FIG. 4 is shown in FIG. 5. In FIG. 5 the signal to be filtered is applied to terminal 50 and coupled to the cascade connected delay elements 51–54. Each of the delay elements 51–54 delays the signal by 2H/20 where H is the period of the horizontal scanning frequency. Note, it is assumed that the signal is in digital format and sampled at a rate of 20 $f_H$. The input signal and the output signals from each of the delay elements are applied to a signal combiner 55 which sums the signals with the polarity shown. That is, the input signal and the output signals from delay elements 52 and 54 are combined in a positive polarity sense with the output signals from delay elements 51 and 53 in a negative polarity sense to produce the bandpass filtered output signal OUT.

Figure 6:
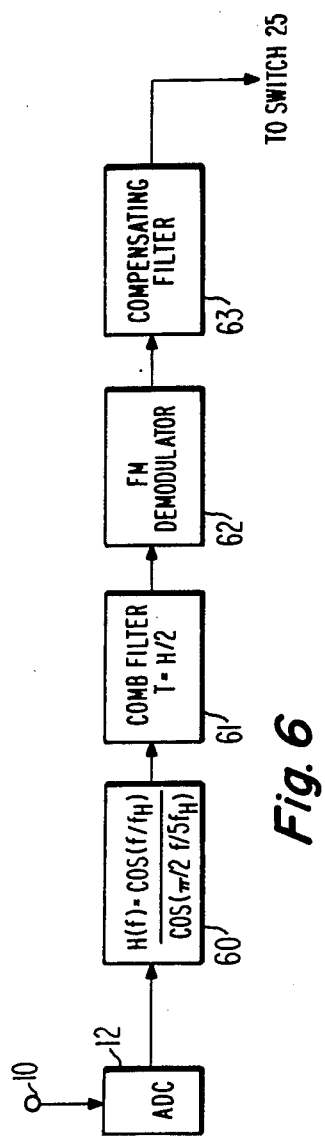
FIG. 6 is a block diagram of filter and demodulation circuitry embodying the present invention which may be utilized in the SAP channel of the FIG. 2 circuitry.

FIG. 6 shows a filtering and demodulating system which may be implemented in the SAP channel for elements 18 and 24 in FIG. 2. Digital samples from ADC 12 are coupled to the bandpass filter 60 which may be similar to the filter illustrated in FIG. 5 and having the transfer function described by equation (4). The bandpass filtered samples are coupled to the comb filter 61 having a transfer function similar to the function illustrated in FIG. 3B. The output of the comb filter is applied to a digital FM demodulator 62. Demodulator 62 may be of the type described in U.S. Pat. No. 4,547,737 entitled "Demodulator of Sampled Data FM Signals From Sets of Four Successive Samples", incorporated herein by reference.

The cosinusoidal amplitude response of the filtered FM signal produced by the comb filter results in a cosinusoidal amplitude response of the demodulated signal. To compensate for the cosinusoidal amplitude response of the demodulated signal, a compensating circuit or filter 63 is cascaded with the FM demodulator. The compensating circuit 63 may be inserted either before or after the FM demodulator. The compensating circuit 63 has a transfer function which tends to be complementary to the cosinusoidal roll-off of the frequency spectrum. An example of such a transfer function $H_c(f)$ is given by $$H_c(f) = 3 - 2 \cos(\pi/2 \, f/f_H). \quad (5)$$

Figure 7:
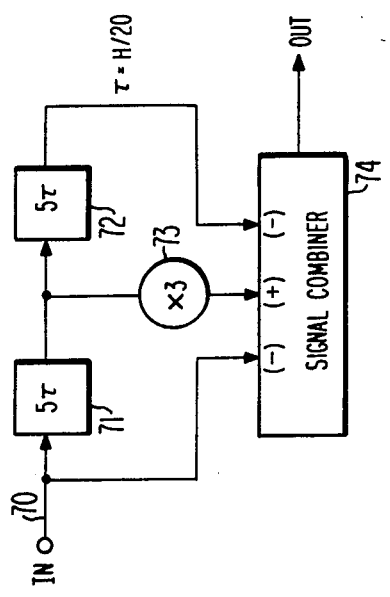
FIG. 7 is a block diagram of exemplary circuitry which may be implemented to compensate amplitude distortion imparted by the comb filter of FIG. 2.

This transfer function may be realized by the circuitry illustrated in FIG. 7. In FIG. 7 the signal to be compensated is applied to terminal 70 and coupled to the cascade connection of delay elements 71 and 72. Delay elements 71 and 72 each delay signal samples by a period of 5H/20 where H is the period of the horizontal scanning frequency. Output signal from delay element 71 is coupled to a scaling circuit 73 which multiplies the signal by a factor of three. The output of scaling circuit 73 is combined in a positive sense with the input signal and the output signal from delay element 72, both in a negative sense, in combining circuit 74. The output of combining circuit 74 provides the compensated signal.

The transfer function described by equation (5) does not provide exact compensation for the cosinusoidal linear distortion but is quite acceptable, particularly in light of the simplicity of the circuitry.

The comb filter frequency response illustrated in FIG. 3B shows the pass-band located in the region of the SAP signal to be symmetrically disposed about the SAP carrier. This is not to be construed as a criterion for the use of a comb filter to separate phase or frequency modulated signals. The requirements for proper operation of a system incorporating a comb filter are that the argument of the cosine of equation (3) not go through 180 degree phase shifts and that the pass-band of the comb filter include substantially all of the sidebands of the information signal to be selectively separated.

The comb filter of FIG. 3A includes a subtraction circuit 40 which establishes the frequency response nulls at even multiples of $f_H$. If an adder circuit is substituted for subtraction circuit 40, the frequency response nulls will occur at odd multiples of $f_H$. A comb filter with frequency response nulls at odd multiples of $f_H$ can be advantageously utilized to separate the (L−R) component of composite sound signal of the (EIAJ) Japanese system stereo TV sound signal. This is so because the (L−R) component of composite sound singal, in the Japanese system, is a FM carrier at $2f_H$. The first nulls in the comb filter frequency response occur at $f_H$ and $3f_H$ and advantagesouly cancels buzz created by these subharmonics.

In the claims appended hereto, the term composite signal is meant to include a signal or signal spectrum which includes more than one information signal such as the BTSC stereo signal. This definition also includes a band of signals received by an FM antenna. Thus, the scope of the claims is intended to include apparatus for separating FM radio signals from the spectrum of braodcast FM signals.

What is claimed is:

1. Apparatus for separating a phase or frequency modulated signal from a composite signal, comprising:
    a source of composite signal including a phase or frequency modulated component;
    a comb filter having a frequency response defined by a plurality of alternating amplitude nulls and a maxima and wherein a frequency spectrum between two successive ones of said nulls encompasses the entire frequency spectrum occupied by said component to be separated;
    a bandpass filter having a pass-band including the frequency spectrum occupied by said component which pass-band is wider than and spans the frequency spectrum between said two successive ones of said nulls;
    means for coupling said comb filter and said bandpass filter in series with said source, wherein said comb filter defines the pass-band frequency response and said bandpass filter provides signal attenuation outside of said pass-band in the series combination of said comb filter and said bandpass filter.

2. The apparatus set forth in claim 1 wherein said comb filter linearly distorts the amplitude response of said component signal and the apparatus further includes:
    circuitry coupled in series with said comb filter and said bandpass filter to correct linear amplitude distortion imparted to said component signal by said comb filter.

3. The apparatus set forth in claim 1 wherein said composite signal includes a frequency modulated carrier, the carrier frequency being substantially an integer multiple, N, of the horizontal scanning frequency, $f_H$, of a television signal, and said comb filter comprises:
    an input terminal;
    a delay element having an input coupled to said input terminal and having an output, said delay element for delaying signal by a period substantially equal to 1/2 the period of the scanning frequency $f_H$;
    signal combining means, having first and second inputs coupled to said input terminal and the output of said delay element respectively, and having an output terminal at which comb filtered signal is produced.

4. The apparatus set forth in claim 3 wherein said combining means is a subtraction circuit and the nulls of said comb filter response occur at even multiples of $f_H$.

5. The apparatus set forth in claim 4 wherein said bandpass filter is a finite impulse response filter, the frequency response of which has a null at $f_H$.

6. In a TV receiver for reproducing stereo sound and secondary audio program (SAP) signals, apparatus for separating FM SAP signal from base-band composite sound signal, comprising:
    a source of said base-band composite sound signal;
    a comb filter, having input and output terminals, and having a frequency response with nulls separated by twice the horizontal scanning frequency of the TV receiver, two successive ones of said nulls being symmetrically disposed about the carrier freqeuncy of said FM SAP signal, the frequency response of said comb filter between said two successive nulls defining the pass-band of the separated FM SAP signal;

a bandpass filter having a pass-band including said two successive nulls, for attenuating signal spectra outside of the spectrum between said two successive nulls; and means for coupling said bandpass filter and said comb filter in series with said source.

7. The apparatus set forth in claim 6 wherein said comb filter comprises:

a delay element, having input and output terminals, for delaying signal by a period equal to one-half the period of said horizontal scanning frequency;

signal combining means having first and second input terminals coupled to the input and output terminals of said delay element respectively for combining signal with delayed signal to produce a comb filtered signal.

8. The apparatus set forth in claim 7 wherein said combining means is a subtraction circuit.

9. Apparatus for separating a component of composite TV stereo sound signal including a pilot signal, comprising:

a source of said composite signal;

a delay element having an input terminal coupled to said source and having an output terminal, for delaying signal available from said source by a period substantially equal to one-half the period of said pilot signal;

combining means coupled to said source and the output of said delay element for combining non-delayed signal from said source and delayed signal from said delay element.

10. Apparatus for separating a component of composite TV stereo sound signal including a pilot signal, comprising:

a source of said composite signal;

a delay element having an input terminal coupled to said source and having an output terminal, for delaying signal available from said source by a period substantially equal to one-half the period of said pilot signal;

combining means coupled to said source and the output of said delay element for combining non-delayed signal from said source and delayed signal from said delay element; and a bandpass filter serially coupled with said delay element and said combining means and having a pass-band greater than the frequency spectrum occupied by the signal to be separated.

* * * * *